(12) United States Patent
Hong et al.

(10) Patent No.: US 8,865,393 B2
(45) Date of Patent: Oct. 21, 2014

(54) PRINTED CIRCUIT BOARD AND METHOD OF MANUFACTURING THE SAME

(75) Inventors: Dae Jo Hong, Gyunggi-do (KR); Chang Sup Ryu, Gyunggi-do (KR); Cheol Ho Choi, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 410 days.

(21) Appl. No.: 13/213,939

(22) Filed: Aug. 19, 2011

(65) Prior Publication Data

US 2012/0043126 A1 Feb. 23, 2012

(30) Foreign Application Priority Data

Aug. 20, 2010 (KR) ........................ 10-2010-0080925

(51) Int. Cl.
| | | |
|---|---|---|
| *G03F 7/20* | (2006.01) | |
| *H05K 3/30* | (2006.01) | |
| *H01L 21/48* | (2006.01) | |
| *H01L 23/498* | (2006.01) | |
| *H01L 21/56* | (2006.01) | |
| *H05K 3/28* | (2006.01) | |
| *H05K 3/34* | (2006.01) | |
| *H01L 23/00* | (2006.01) | |

(52) U.S. Cl.
CPC ...... *H05K 3/305* (2013.01); *H05K 3/28* (2013.01); *H05K 3/3436* (2013.01); *H05K 3/3452* (2013.01); *H01L 2224/32225* (2013.01); *H01L 2224/73204* (2013.01); *H01L 21/4853* (2013.01); *H01L 24/16* (2013.01); *H01L 2224/16227* (2013.01); *H01L 2224/81192* (2013.01); *H01L 23/49822* (2013.01); *H01L 23/49827* (2013.01); *H01L 23/49894* (2013.01); *H01L 2224/131* (2013.01); *H01L 21/563* (2013.01)
USPC .......................................... 430/311

(58) Field of Classification Search
CPC .................................... G03F 7/20; H05K 3/28
USPC ........................................... 430/311
See application file for complete search history.

(56) References Cited

U.S. PATENT DOCUMENTS

2006/0091548 A1* 5/2006 Naiki et al. .................. 257/753
2009/0038839 A1* 2/2009 Hashimoto et al. .......... 174/350

* cited by examiner

*Primary Examiner* — Kathleen Duda
(74) *Attorney, Agent, or Firm* — Bracewell & Giuliani LLP; Brad Y. Chin

(57) ABSTRACT

Disclosed herein are a printed circuit board and a method of manufacturing the same, including: forming a protective layer on which a cover film is stacked on a base substrate; exposing the protective layer on which the cover film is stacked to photosensitize the protective layer and photodegrade the cover film; and developing the photodegraded cover film and the photosensitized protective layer to form an opening exposing a pad unit of a circuit layer which is an outermost layer of the base substrate on the protective layer, whereby the productivity of the printed circuit board can be improved without performing a process of separating a cover film.

10 Claims, 5 Drawing Sheets

PRINTED CIRCUIT BOARD AND METHOD OF MANUFACTURING THE SAME

CROSS REFERENCE TO RELATED APPLICATION

This application claims the benefit of Korean Patent Application No. 10-2010-0080925, filed on Aug. 20, 2010, entitled "A Printed Circuit Board And A Method Of Manufacturing The Same", which is hereby incorporated by reference in its entirety into this application.

BACKGROUND OF THE INVENTION

1. Technical Field

The present invention relates to a printed circuit board and a method of manufacturing the same.

2. Description of the Related Art

Generally, a printed circuit board (PCB) is a component, which serves to simply connect devices of several electronic products according to a predetermined frame and is widely used in all electronic products from home appliances including a digital TV to advanced communication equipment. The printed circuit board (PCB) is classified into a universal printed circuit board, a printed circuit board for a module, a printed circuit board for a package, and the like.

As a technology for a high integrated semiconductor chip and a high signal transfer rate, a demand for a technology directly mounting a semiconductor chip on a printed circuit board has recently increased and thus a development of a printed circuit board having high integration and high reliability capable of responding to the high integration of the semiconductor chip has been needed. In addition, as the demand for the printed circuit board has increased, research for a method capable of improving productivity of the printed circuit board is being conducted.

FIGS. 1 to 5 are process cross-sectional views for explaining a method of manufacturing a printed circuit board 10 according to the prior art. Hereinafter, the method of manufacturing the printed circuit board 10 according to the prior art will be described with reference to the figures.

First, as shown in FIG. 1, a base substrate 11 including an insulating layer 12 and a circuit layer 13 is prepared.

Next, as shown in FIG. 2, a solder resist layer 15 on which a cover film 14 is stacked is formed on the base substrate 11.

Next, as shown in FIG. 3, an exposure mask 16 is positioned on the cover film 14 and the solder resist layer 15 is exposed.

Next, as shown in FIG. 4, the exposure mask 16 is separated and waited for a predetermined time, and then the cover film 14 is removed. At this time, a time point when the solder resist layer 15 is exposed to air is constantly maintained to induce a photo coupling reaction between oxygen in the air and the solder resist layer 150.

Next, as shown in FIG. 5, the portion of the solder resist layer 15 not photosensitized by a developing process is removed to form an opening 18 exposing a pad unit 17 of the circuit layer 13 of the base substrate 11.

The printed circuit board 10 according to the prior art is manufactured through the manufacturing process as described above.

However, in the method of manufacturing the printed circuit board 10 according to the prior art, the cover film 14 should be removed from the solder resist layer 15 before the developing process after the exposing process, such that manufacturing time and manufacturing costs of the printed circuit board 10 are increased, as a result, productivity is decreased.

SUMMARY OF THE INVENTION

The present invention has been made in an effort to provide a printed circuit board that does not need to remove a cover film to improve productivity, and a method of manufacturing the same.

A printed circuit board according to a preferred embodiment of the present invention includes: a base substrate; a protective layer formed on the base substrate and formed with an opening exposing a pad unit of a circuit layer which is an outermost layer of the base substrate; and an adhesive layer formed on the protective layer and photocured.

Herein, the adhesive layer includes an acrylic adhesive and a photocurable additive.

The protective layer is a solder resist layer.

A method of manufacturing a printed circuit board according to a preferred embodiment of the present invention includes: forming a protective layer on which a cover film is stacked on a base substrate; exposing the protective layer on which the cover film is stacked to photosensitize the protective layer and photodegrade the cover film; and developing the photodegraded cover film and the photosensitized protective layer to form an opening exposing a pad unit of a circuit layer which is an outermost layer of the base substrate on the protective layer.

At the exposing, the cover film corresponding to a region in which the opening is formed is consecutively photodegraded by a photodegradation reaction of the cover film corresponding to a region that light reaches by a patterned exposure mask.

The cover film includes a photodegradable polymer.

The cover film further includes an ultraviolet stabilizer and a photodegradable activator.

The cover film includes: a supporting layer having photodegradation; and an adhesive layer bonding the supporting layer to the protective layer and having photocuring.

The adhesive layer is photocured at the exposing the protective layer and is maintained on the protective layer even after the developing the opening.

The supporting layer is consecutively photodegraded at the exposing to be removed at the developing, and the region of the adhesive layer, that light reaches at the exposing, is photocured to be maintained on the protective layer even after the developing, and the region of the adhesive layer, corresponding to the opening, is removed at the developing.

At the developing, the photodegraded cover film is dissolved in a developer to be removed.

The adhesive layer includes an acrylic adhesive and a photocurable additive.

The protective layer is a solder resist layer.

DESCRIPTION OF THE PREFERRED EMBODIMENTS

Figure 1:
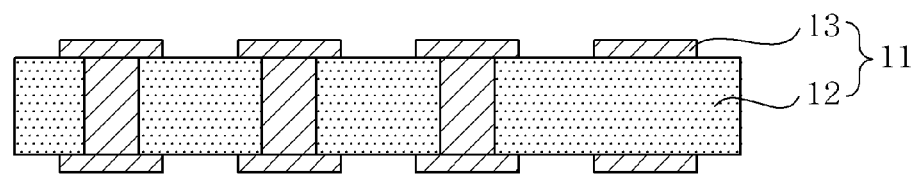
FIGS. 1 to 5 are process cross-sectional views for explaining a method of manufacturing a printed circuit board according to the prior art.
Figure 2:
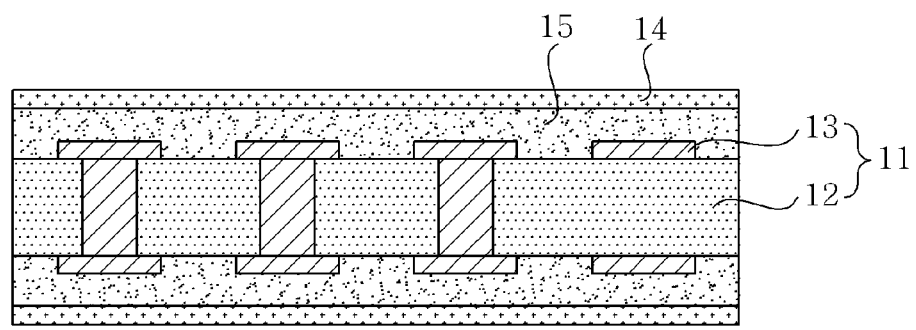
Figure 3:
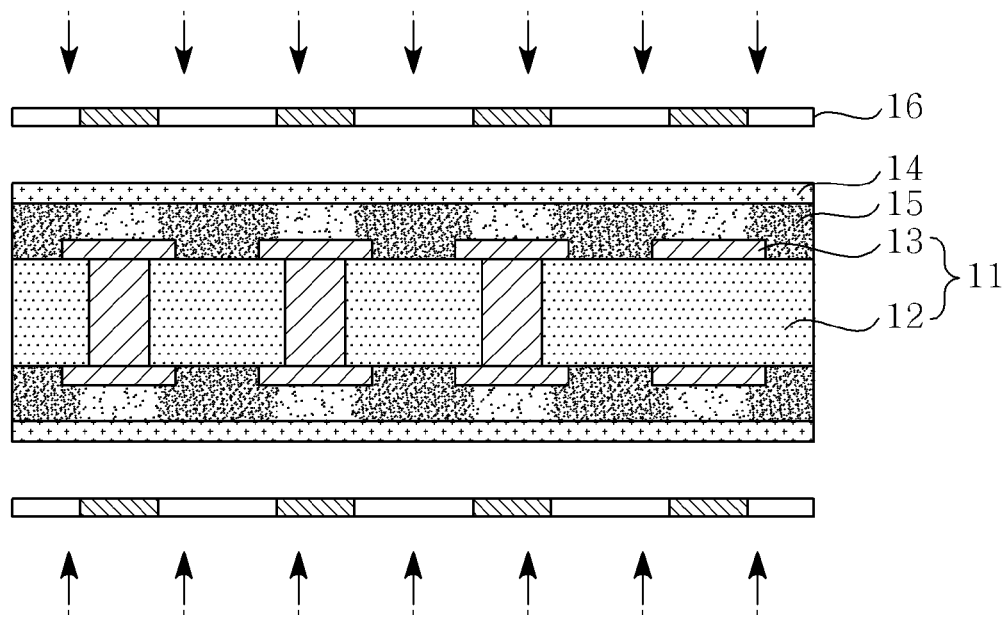
Figure 4:
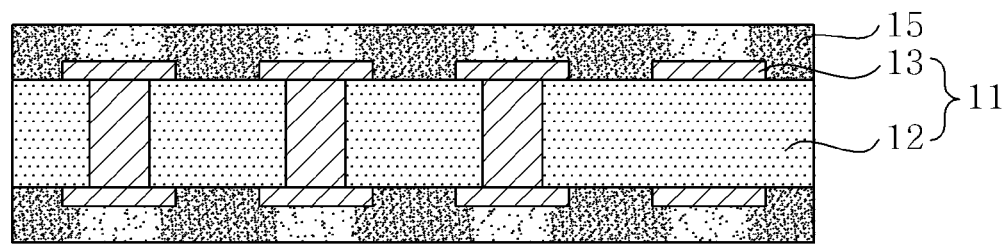
Figure 5:
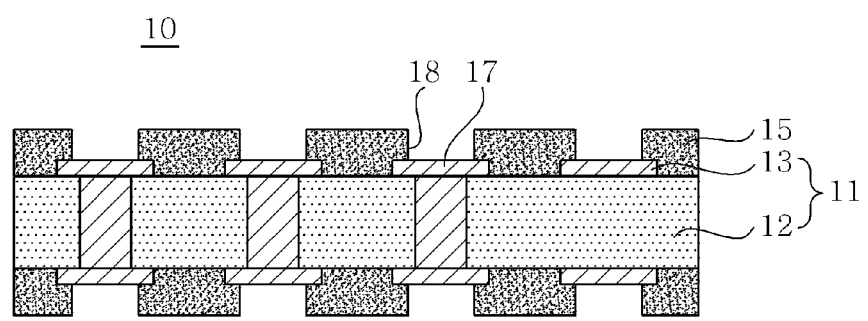

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

In the specification, in adding reference numerals to components throughout the drawings, it is to be noted that like reference numerals designate like components even though components are shown in different drawings. Further, terms used in the specification, 'first', 'second', etc. can be used to describe various components, but the components are not to be construed as being limited to the terms. The terms are only used to differentiate one component from other components. Further, when it is determined that the detailed description of the known art related to the present invention may obscure the gist of the present invention, the detailed description thereof will be omitted.

Hereinafter, preferred embodiments of the present invention will be described in detail with reference to the accompanying drawings.

Structure of Printed Circuit Board

Figure 6:
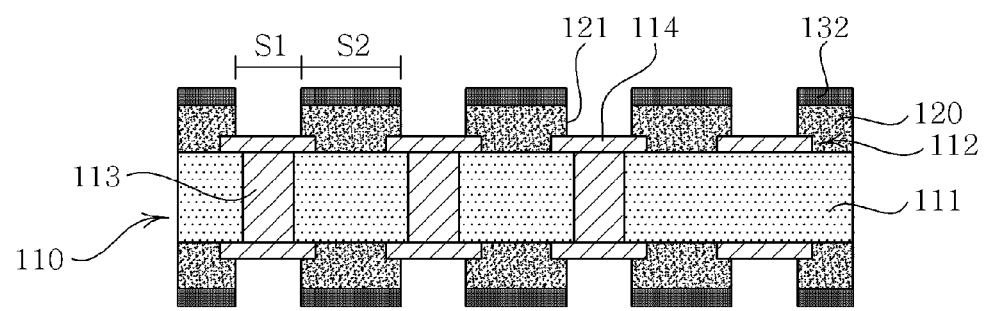
FIG. 6 is a cross-sectional view of a printed circuit board according to a preferred embodiment of the present invention.
Figure 7:
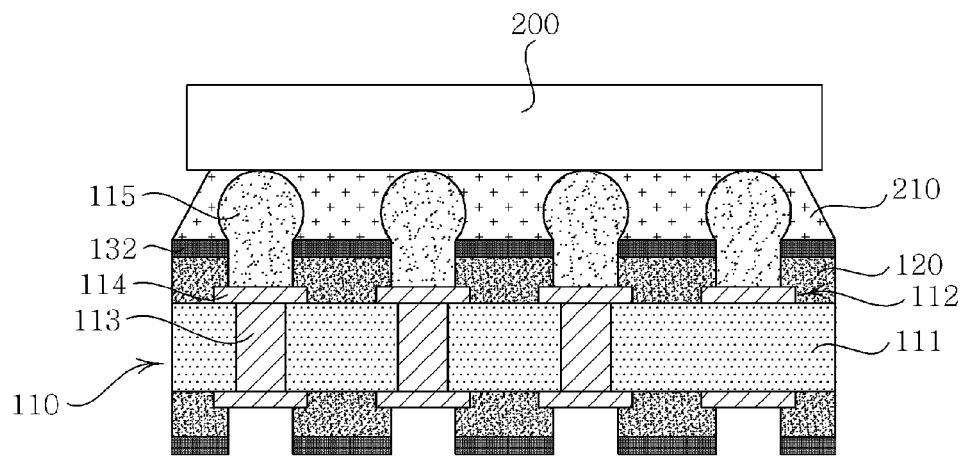
FIG. 7 is a diagram for explaining that an external device is connected to the printed circuit board of FIG. 6.

FIG. 6 is a cross-sectional view of a printed circuit board according to a preferred embodiment of the present invention and FIG. 7 is a diagram for explaining that an external device 200 is connected to the printed circuit board of FIG. 6. Hereinafter, the printed circuit board 100 according to the present embodiment will be described with reference to the figures.

As shown in FIG. 6, the printed circuit board according to the present embodiment includes a base substrate 110, a protective layer 120 formed on the base substrate 110, and an adhesive layer 132 formed on the protective layer 120.

The base substrate 110 is a member that becomes a base of the printed circuit board.

Herein, the base substrate 110 may be a build-up layer configured of a multi or single insulating layer 111, a circuit layer 112, and a via 113. In this case, the insulating layer 111 may use a composite polymer resin that is generally used as an interlayer insulation material. For example, the insulating layer 111 uses prefreg, thereby making it possible to manufacture the printed circuit board thinner. Alternatively, the insulating layer 111 uses an Ajinomoto Build up Film (ABF), thereby making it possible to easily implement a fine circuit. Besides, the insulating layer 111 may use an epoxy-based resin such as FR-4, Bismaleimide Triazine (BT), or the like, but it is not particularly limited thereto. In addition, the circuit layer 112 may be made of, for example, an electrical conductive metal such as gold, silver, copper, nickel, or the like.

The protective layer 120, which is a member for protecting the base substrate 110, may be formed on one surface or both surfaces of the base substrate 110.

Herein, the protective layer 120 may be made of solder resist, for example, liquid-phase solder resist, or the like, so as to protect other constituents of the printed circuit board. In addition, an opening 121 that exposes a pad unit 114 of the circuit layer 112 formed on the outermost layer of the base substrate 110 may be formed in the protective layer 120.

Meanwhile, a surface treatment layer (not shown) that improves electrical characteristics and durability may be further formed on the pad unit 114. The surface treatment layer (not shown) may be formed by performing an electro or electroless Tin plating treatment, an organic solderability preservative (OSP) treatment, a hot air solder leveling (HASL) treatment, or the like on the pad unit 114 by way of example. In addition, as shown in FIG. 7, a solder ball 115 electrically connected to the pad unit 114 is formed in the opening 121, thereby making it possible to connect the printed circuit board to an external device 200.

The adhesive layer 132, which is a member formed on the protective layer 120, is a member to improve adhesion between the printed circuit board and the external device 200.

In this case, the adhesive layer 132 may be in a photocured state. More specifically, the adhesive layer 132 may include an acrylic adhesive such as n-butyl acrylate, ethyl acrylate, acrylic acid, methacrylic acid, itaconic acid, or the like, and a photocurable additive such as di-functional urethane acrylate, hexa-functional urethane acrylate oligomer, or the like. The adhesive layer 132 may be photocured during an exposure process for forming the opening 121 of the protective layer 120.

In addition, the adhesive layer 132 may be formed on the protective layer 120. More specifically, the adhesive layer 132 may be formed on the upper portion of the protective layer 120, not being formed in a region of the protective layer 120, in which the opening 121 is formed.

Meanwhile, as shown in FIG. 7, when the external device 200 is connected to the printed circuit board by the solder ball 115 formed on the pad unit 114, an underfill 210 may be filled between the printed circuit board and the external device 200. At this time, when the adhesive layer 132 is formed on the protective layer 120, the adhesive layer 132 is in direct contact with the underfill 210, such that the adhesive layer 132 can control flowability of the underfill 210. In addition, the adhesive layer 132 has roughness to improve adhesion between the printed circuit board and the underfill 210, thereby making it possible to strongly bond the printed circuit board to the external device 200.

Method of Manufacturing Printed Circuit Board

FIGS. 8 to 11 are process diagrams for explaining a method of manufacturing the printed circuit board of FIG. 6. Hereinafter, a method of manufacturing the printed circuit board according to a preferred embodiment of the present invention will be described with reference to the figures.

Meanwhile, the protective layer 120 and the cover film 130 are shown to be formed on both surfaces of the base substrate 110 in FIGS. 8 to 11, but they may also be formed on one surface thereof.

Figure 8:
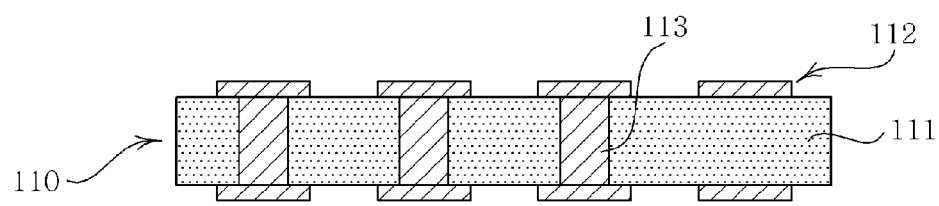
FIGS. 8 to 11 are diagrams for explaining a method of manufacturing the printed circuit board of FIG. 6.

First, as shown in FIG. 8, a base substrate 110 is prepared.

At this time, the base substrate 110 may include a multi or single insulating layer 111 and a circuit layer 112. In this case, the circuit layer 112 may be formed on the insulating layer by, for example, an additive method, a subtractive method, a semi-additive method, a modified semi-additive method, or the like. In addition, after the base substrate 110 is formed, roughness may be formed by performing micro etching on the circuit layer 112 that is an outermost layer, so as to improve adhesion between the protective layer 120 and the base substrate 110.

Figure 9:
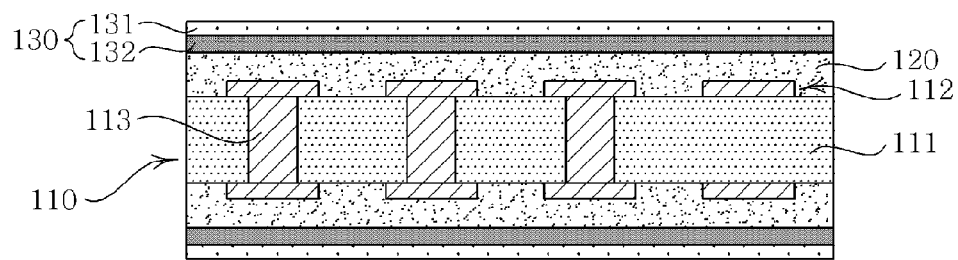

Next, as shown in FIG. 9, a protective layer 120 on which a cover film 130 is stacked is formed on the base substrate 110.

In this case, the cover film 130 is a member formed to be in contact with the protective layer 120 to protect the protective layer 120 during the exposure process of the protective layer 120 while transferring the printed circuit board. In addition, the cover film 130 may include an adhesive layer 132 in contact with the protective layer 120 and a supporting layer 131 formed on the adhesive layer 132.

In this case, the supporting layer 131, which is a photodegradable material, is a member photodegraded during an exposure process described below. In addition, the supporting layer 131 includes a photodegradable polymer, an ultraviolet stabilizer, and a photodegradable activator as a photodegradable material. When the supporting layer 131 is exposed to a certain wavelength for several seconds, the physical and chemical properties thereof are degraded as a chain of the polymer is cut and a molecular weight thereof is eventually decreased, thereby being degraded or separated into small pieces. In addition, the photodegradable polymer may have a composition that is easily photodegraded when being irradiated with a wavelength having a predetermined region such as oligomer capable of forming a PET such as oligo(ethylene terephtalate, oligo(ethylene succinate-ci-tetrephtalate, or the like, quinnonthiazide, novolac plastic, or the like.

In addition, the adhesive layer 132, which is a member mutually bonding the supporting layer 131 to the cover film 130, may be made of a photocurable material. Therefore, when light is irradiated during an exposure process described below, a region of the adhesive layer 132, to which the light is irradiated, may be photocured.

Meanwhile, the present embodiment describes the case in which the protective layer 120 on which the cover film 130 is stacked is formed on the base substrate 110, but the cover film 130 may also be stacked on the protective layer 120 after the protective layer 120 is formed on the base substrate 110.

Figure 10:
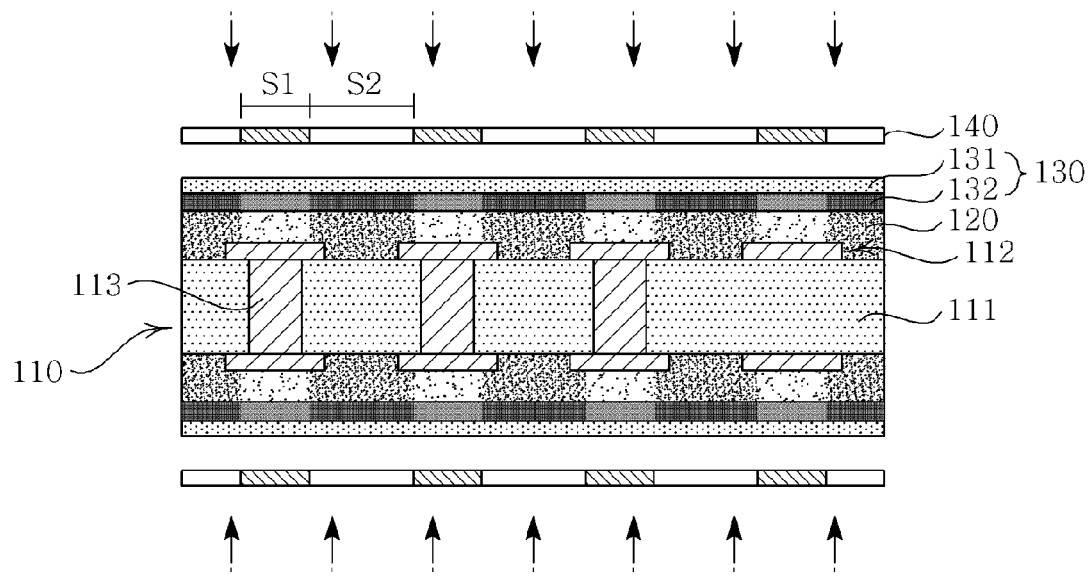

Next, as shown in FIG. 10, the protective layer 120 on which the cover film 130 is stacked is exposed.

At this time, only a portion of a wavelength of an ultraviolet ray band is used in photodegrading and photocuring the cover film 130. Therefore, the cover film 130 transmits most of the ultraviolet light, without reflecting or absorbing the ultraviolet light. As a result, the transmittance of the cover film 130 may become 90% at the minimum, thereby making it possible to not interrupt the irradiated ultraviolet light from being irradiated to the protective layer 120. Therefore, light passing through the exposure mask 140 subsequently reaches the protective layer 120 corresponding to a second region S2 except for a first region S1 in which the opening 121 is formed, such that the protective layer 120 corresponding to the second region S2 can be photosensitized.

In addition, the supporting layer 131 of the cover film 130 can be photodegraded as the light passing through the exposure mask 140 is transferred to the supporting layer 131 corresponding to the second region S2. More specifically, the light reaches the supporting layer 131 corresponding to the second region S2 to cut the chain of the polymer, thereby photodegrading the supporting layer 131. When the photodegradation reaction starts on the supporting layer 131 corresponding to the second region S2, reactions are consecutively generated, such that the photodegration reaction may be generated even on the supporting layer 131 corresponding to the first region S1 which the light does not reach. Therefore, the entire supporting layer 131 can be consecutively photodegraded regardless of the first region S1 and the second region S2.

Meanwhile, the adhesive layer 132 of the cover film 130 can be photocured as the light passing through the exposure mask 140 is transferred to the adhesive layer 132 corresponding to the second region S2. In this case, since the light does not reach the adhesive layer 132 corresponding to the first region S1, the adhesive layer 132 corresponding to the first region S1 may not be photocured. In addition, the adhesive layer 132 is photocured, such that the adhesion between the adhesive layer 132 and the supporting layer 131 may be decreased.

Figure 11:
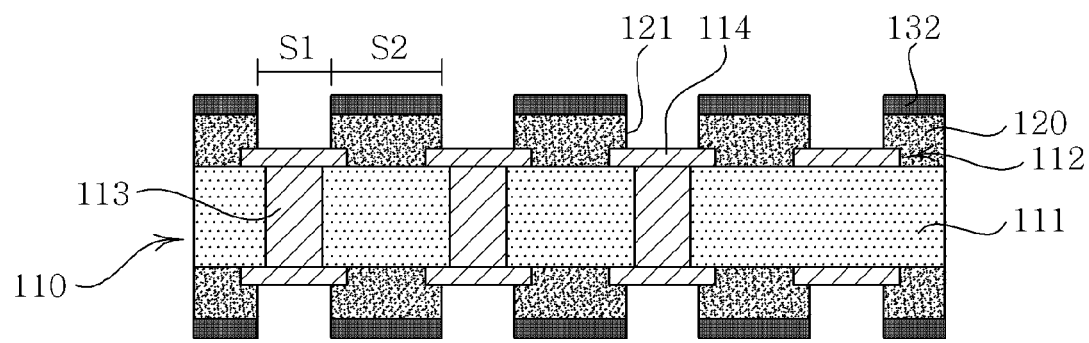

Next, as shown in FIG. 11, a developing process is performed on the protective layer 120 on which the cover film 130 is stacked.

In this case, a developer is added on the protective layer 120 on which the cover film 130 is stacked, thereby making it possible to develop the protective layer 120. More specifically, since the supporting layer 131 of the cover film 130 is photodegraded during an exposure process, it may be dissolved in the developer to be removed. Further, a portion of the adhesive layer 132, not photocured, that is, the adhesive layer 132 corresponding to the first region S1, may also be dissolved in the developer to be removed. In this case, even though not being completely dissolved in the developer, the supporting layer 131 and the adhesive layer 132 corresponding to the first region S1 are in a state in which a molecular weight is low, such that they may be washed by the developer to be removed. In this case, a portion of the protective layer 120, corresponding to the first region S1, is not photosensitized either, such that it may be dissolved by the developer to be removed. In addition, the developer may use a general developer, for example, sodium carbonate solution (Na2O3), or the like. Consequently, the supporting layer 131, the adhesive layer 132 corresponding to the first region S1, and the protective layer 120 corresponding to the first region S1 are removed by the developing process, such that the protective layer 120 corresponding to the second region S2 and the adhesive layer 132 corresponding to the second region S2 may be maintained on the base substrate 110.

In addition, when a portion of the protective layer 120, corresponding to the first region S1, is removed, the pad unit 114 of the circuit layer 112 formed on the outermost layer of the base substrate 110 may be exposed to the outside. In other words, the protective layer 120 corresponding to the first region S1 is removed, such that the opening 121 exposing the pad unit 114 may be formed in the protective layer 120.

Meanwhile, as the cover film 130 is photodegraded during the exposing process and is developed during the developing process, a separating process of the cover film 130 is not needed in the manufacturing process of the printed circuit board. Therefore, the number of processes is decreased to reduce manufacturing time of the printed circuit board, thereby making it possible to improve productivity. In addition, a separate process of removing the cover film 130 is not needed, thereby making it possible to implement the exposing process and the developing process in a single line or apparatus.

The printed circuit board according to a preferred embodiment of the present invention as shown in FIG. 11 is manufactured according to the manufacturing process as described above.

The printed circuit board and the method of manufacturing the same according to the present invention use the cover film having photodegration to photodegrade the cover film by the exposing process and to remove it by the developing process, such that a separate process for removing the cover film is not required, thereby making it possible to improve productivity of the printed circuit board.

In addition, according to the present invention, a separate process for removing the cover film is not required, thereby making it possible to perform the exposing process, the removing process of the cover film, and the developing process in a single process or apparatus.

In addition, according to the present invention, the adhesive layer of the cover film is maintained on the protective layer, thereby making it possible to improve adhesion between the printed circuit board and the external device.

Although the preferred embodiments of the present invention have been disclosed for illustrative purposes, they are for specifically explaining the present invention and thus a printed circuit board and a method of manufacturing the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A method of manufacturing a printed circuit board, comprising:
    forming a protective layer on which a cover film is stacked on a base substrate;
    exposing the protective layer on which the cover film is stacked to photosensitize the protective layer and photodegrade the cover film; and
    developing the photodegraded cover film and the photosensitized protective layer to form an opening exposing a pad unit of a circuit layer which is an outermost layer of the base substrate on the protective layer.

2. The method of manufacturing a printed circuit board as set forth in claim 1, wherein at the exposing, the cover film corresponding to a region in which the opening is formed is consecutively photodegraded by a photodegradation reaction of the cover film corresponding to a region that light reaches by a patterned exposure mask.

3. The method of manufacturing a printed circuit board as set forth in claim 1, wherein the cover film includes a photodegradable polymer.

4. The method of manufacturing a printed circuit board as set forth in claim 3, wherein the cover film further includes an ultraviolet stabilizer and a photodegradable activator.

5. The method of manufacturing a printed circuit board as set forth in claim 1, wherein the cover film includes:
    a supporting layer having photodegradation; and
    an adhesive layer bonding the supporting layer to the protective layer and having photocuring.

6. The method of manufacturing a printed circuit board as set forth in claim 5, wherein the adhesive layer is photocured at the exposing the protective layer and is maintained on the protective layer even after the developing the opening.

7. The method of manufacturing a printed circuit board as set forth in claim 5, wherein the supporting layer is consecutively photodegraded at the exposing to be removed at the developing, and
    the region of the adhesive layer, that light reaches at the exposing, is photocured to be maintained on the protective layer even after the developing, and the region of the adhesive layer, corresponding to the opening, is removed at the developing.

8. The method of manufacturing a printed circuit board as set forth in claim 1, wherein at the developing, the photodegraded cover film is dissolved in a developer to be removed.

9. The method of manufacturing a printed circuit board as set forth in claim 1, wherein the adhesive layer includes an acrylic adhesive and a photocurable additive.

10. The method of manufacturing a printed circuit board as set forth in claim 1, wherein the protective layer is a solder resist layer.

* * * * *